(12) United States Patent
Lee et al.

(10) Patent No.: US 8,860,203 B2
(45) Date of Patent: Oct. 14, 2014

(54) STRETCHABLE BASE PLATE AND STRETCHABLE ORGANIC LIGHT-EMITTING DISPLAY DEVICE

(71) Applicant: Samsung Display Co., Ltd., Yongin (KR)

(72) Inventors: Chang-Hoon Lee, Yongin (KR); Jong-Ho Hong, Yongin (KR); Won-Sang Park, Yongin (KR); Jong-In Baek, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/831,225

(22) Filed: Mar. 14, 2013

(65) Prior Publication Data

US 2014/0138635 A1 May 22, 2014

(30) Foreign Application Priority Data

Nov. 16, 2012 (KR) ........................ 10-2012-0130516

(51) Int. Cl.
| | | |
|---|---|---|
| *H01L 23/48* | (2006.01) | |
| *H05K 1/02* | (2006.01) | |
| *H01L 51/52* | (2006.01) | |
| *H01L 51/56* | (2006.01) | |
| *H05K 3/46* | (2006.01) | |

(52) U.S. Cl.
CPC .......... *H05K 1/0283* (2013.01); *H01L 51/5203* (2013.01); *H01L 51/56* (2013.01); *H05K 3/46* (2013.01)
USPC ............ 257/688; 257/E23.055; 257/E23.065; 257/E23.078; 257/E23.177; 257/689

(58) Field of Classification Search
CPC .................... H01L 51/0097; H01L 2251/5338
USPC .................. 257/688, 689, E23.055, E23.065, 257/E23.078
See application file for complete search history.

(56) References Cited

U.S. PATENT DOCUMENTS

| | | | | |
|---|---|---|---|---|
| 6,819,045 | B2 * | 11/2004 | Okita et al. ................... | 313/511 |
| 7,199,527 | B2 * | 4/2007 | Holman ......................... | 313/511 |
| 7,501,069 | B2 * | 3/2009 | Liu et al. .......................... | 216/2 |
| 7,564,528 | B2 * | 7/2009 | Burberry et al. .............. | 349/138 |
| 7,568,961 | B2 * | 8/2009 | Kim ................................ | 445/24 |
| 7,573,024 | B2 * | 8/2009 | Knopf et al. .................. | 250/239 |
| 7,622,367 | B1 * | 11/2009 | Nuzzo et al. .................. | 438/472 |
| 7,787,097 | B2 * | 8/2010 | Satoh ............................ | 349/158 |

(Continued)

FOREIGN PATENT DOCUMENTS

| | | |
|---|---|---|
| JP | 10-149764 | 6/1998 |
| JP | 2001-266775 A | 9/2001 |
| JP | 2006-261528 | 9/2006 |
| JP | 2006-266775 | 10/2006 |

*Primary Examiner* — Ida M Soward
(74) *Attorney, Agent, or Firm* — Christie, Parker & Hale, LLP

(57) ABSTRACT

A stretchable organic light-emitting display device includes a stretchable base plate including a stretchable substrate, first metal electrodes that are separated from each other and located in a plurality of rows on a the stretchable substrate, and first power wirings electrically coupling respective ones of the metal electrodes of each row, a light-emitting layer on the stretchable base plate, second metal electrodes located in a plurality of rows on the light-emitting layer and corresponding to the first metal electrodes, second power wirings for electrically coupling respective ones of the second metal electrodes of each row, and an encapsulation substrate covering the second power wiring.

10 Claims, 7 Drawing Sheets

(56) References Cited

U.S. PATENT DOCUMENTS

| | | | |
|---|---|---|---|
| 7,932,511 B2 * | 4/2011 | Duan et al. | 257/9 |
| 8,128,447 B2 * | 3/2012 | Takahashi | 445/24 |
| 8,345,436 B2 * | 1/2013 | Kitada et al. | 361/777 |
| 8,399,301 B2 * | 3/2013 | Park et al. | 438/122 |
| 8,502,228 B2 * | 8/2013 | Matsubara et al. | 257/59 |
| 8,546,822 B2 * | 10/2013 | Hsu | 257/88 |
| 2005/0259211 A1 * | 11/2005 | Stephenson et al. | 349/167 |
| 2006/0169989 A1 * | 8/2006 | Bhattacharya et al. | 257/79 |
| 2007/0025139 A1 * | 2/2007 | Parsons | 365/151 |
| 2008/0224331 A1 * | 9/2008 | Neishi | 257/785 |
| 2011/0084349 A1 * | 4/2011 | Uchida et al. | 257/421 |
| 2012/0288685 A1 * | 11/2012 | Yukawa et al. | 428/172 |
| 2013/0119348 A1 * | 5/2013 | Zhou et al. | 257/29 |
| 2013/0140528 A1 * | 6/2013 | De Kok et al. | 257/40 |
| 2013/0193844 A1 * | 8/2013 | Morita et al. | 313/504 |
| 2014/0012106 A1 * | 1/2014 | Mascaro et al. | 600/323 |
| 2014/0039290 A1 * | 2/2014 | De Graff et al. | 600/377 |
| 2014/0070190 A1 * | 3/2014 | Chen | 257/40 |

* cited by examiner

STRETCHABLE BASE PLATE AND STRETCHABLE ORGANIC LIGHT-EMITTING DISPLAY DEVICE

CROSS-REFERENCE TO RELATED PATENT APPLICATION

This application claims priority to and the benefit of Korean Patent Application No. 10-2012-0130516, filed on Nov. 16, 2012, in the Korean Intellectual Property Office, the disclosure of which is incorporated herein in its entirety by reference.

BACKGROUND

1. Field

Embodiments of the present invention relate to an organic light-emitting display device and a method of manufacturing the same.

2. Description of the Related Art

Conventionally, an organic light-emitting display device may display colors when electrons and holes, which are respectively injected from an anode and a cathode, recombine to emit light. The organic light-emitting display device has a structure formed by stacking an anode electrode and a cathode electrode with a light-emitting layer inserted therebetween.

Recently, there have been attempts to implement an organic light-emitting display device that has a stretchable structure. That is, it is desirable to form an organic light-emitting display device to extend/expand or shrink, as well as bend, when the organic light-emitting display device is pulled.

To enable stretchable characteristics, a stretchable substrate may be used. However, when the substrate is stretched, cracks may be generated in a metal electrode(s) of the substrate. That is, even if the substrate is stretchable, the metal electrode is not equally stretchable. Therefore, cracks may be generated in the metal electrode due to stress caused by extension, shrinkage, or bending of the substrate.

Accordingly, it may be useful to develop a structure for preventing cracks in the metal electrode when the substrate is stretched or bent to provide a stretchable organic light-emitting display device.

SUMMARY

Embodiments of the present invention provide a stretchable base plate that is improved to be stretched without generating cracks in a metal electrode, a stretchable organic light-emitting display device using the same, and a method of manufacturing the stretchable base plate and the stretchable organic light emitting display device.

According to an aspect of embodiments of the present invention, there is provided a stretchable base plate including a stretchable substrate, metal electrodes that are separated and located in a plurality of rows on the stretchable substrate, and a power wiring for electrically coupling respective ones of the metal electrodes in each row.

The stretchable substrate may include a stack of several layers of unit substrates.

The stretchable substrate may include polydimethylsiloxane (PDMS).

The metal electrodes may include aluminum.

The power wiring may include silver nanowires.

According to an aspect of embodiments of the present invention, there is provided a stretchable organic light-emitting display device including a stretchable base plate including a stretchable substrate, first metal electrodes that are separated from each other and located in a plurality of rows on a the stretchable substrate, and first power wirings electrically coupling respective ones of the metal electrodes of each row, a light-emitting layer on the stretchable base plate, second metal electrodes located in a plurality of rows on the light-emitting layer and corresponding to the first metal electrodes, second power wirings for electrically coupling respective ones of the second metal electrodes of each row, and an encapsulation substrate covering the second power wiring.

The stretchable substrate may include a plurality of unit substrates stacked in layers, and each row of the first metal electrodes may correspond to a respective one of the unit substrates.

The stretchable substrate and the encapsulation substrate may include polydimethylsiloxane (PDMS).

The first and second metal electrodes may include aluminum.

The first power wirings and the second power wirings may include silver nanowires.

According to an aspect of the present invention, there is provided a method of manufacturing a stretchable base plate, the method including forming power wirings in a plurality of rows on a stretchable unit substrate, forming metal electrodes on the power wirings, stacking several stretchable unit substrates each including respective ones of the power wirings and the metal electrodes, and cutting the stack to separate the rows of the power wirings on respective ones of the stretchable unit substrates.

The metal electrodes may include a plurality of separated pieces after the stack is cut.

The stretchable substrate may include polydimethylsiloxane (PDMS).

The metal electrodes may include aluminum.

The power wirings may include silver nanowires.

According to an aspect of embodiments of the present invention, there is provided a method of manufacturing a stretchable organic light-emitting display device, the method including preparing a stretchable base plate including a stretchable substrate, first metal electrodes including separate pieces in a plurality of rows on the stretchable substrate, and first power wirings electrically coupling respective ones of the first metal electrodes of each row, forming a light-emitting layer on the stretchable base plate, forming second metal electrodes in a plurality of rows on the light-emitting layer to correspond to the first metal electrodes, forming second power wirings electrically coupling respective ones of the second metal electrodes of each row, and covering the second power wirings with an encapsulation substrate.

The preparing of the stretchable base plate may include forming the first power wirings in a plurality of rows on respective ones of stretchable unit substrates, forming the first metal electrodes on the first power wiring, stacking a plurality of stretchable unit substrates in layers, and forming the stretchable substrate by cutting the stack of the stretchable unit substrates along a direction parallel to the rows of the first power wirings.

The stretchable substrate and the encapsulation substrate may include polydimethylsiloxane (PDMS).

The first metal electrode and the second metal electrode may include aluminum.

The first power wirings and the second power wirings may include silver nanowires.

According to embodiments of the present invention for providing the stretchable base plate, the stretchable organic light emitting display device, and the method of manufacturing the stretchable base plate, cracks in metal electrodes are reduced or prevented during stretching or bending. Thus, a stretchable product may be implemented.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Hereinafter, exemplary embodiments of the present invention will be described fully with reference to the accompanying drawings.

Figure 1:
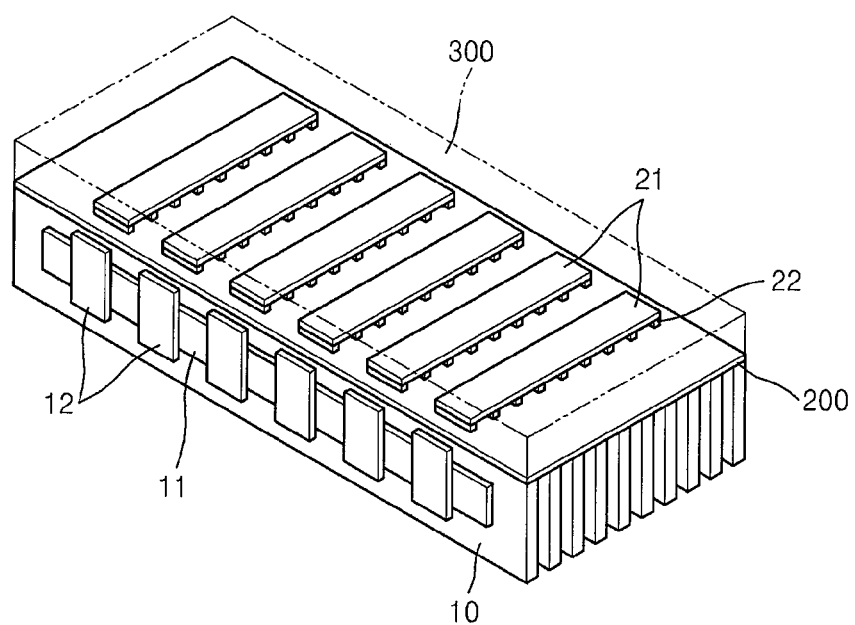
FIG. 1 is a cross-sectional view of a stretchable organic light-emitting display device according to an embodiment of the present invention.

FIG. 1 is a cross-sectional view of a stretchable organic light-emitting display device according to an embodiment of the present invention. In FIG. 1, a passive-matrix organic light-emitting display device is provided as an example.

As illustrated in FIG. 1, the stretchable organic light-emitting display device in the present embodiment includes a stretchable base plate 100 (see FIG. 2F), a light-emitting layer 200 formed thereon, second metal electrodes 22 and second power wirings 21 that are provided to respectively correspond to first metal electrodes 12 and a first power wiring(s) 11 with the light-emitting layer 200 therebetween (e.g., the second metal electrodes 22 may face corresponding ones of the first metal electrodes 12), and an encapsulation substrate 300 for covering the second metal electrodes 22 and the second power wirings 21.

A stretchable substrate 10 and the encapsulation substrate 300 of the stretchable base plate 100 of the present embodiment may be made of highly stretchable polydimethylsiloxane (PDMS). Thus, the stretchable substrate 10 and the encapsulation substrate 300 may be stretched or bent when pulled or twisted.

To reduce or prevent cracks in the first and second metal electrodes 12 and 22, the first and second metal electrodes 12 and 22 are separately located as several separate pieces in the current embodiment. That is, the stretchable substrate 10 of the base plate 100 is formed of a stack of several layers of unit substrates 10a (refer to FIG. 2A) which are made of PDMS. The first and second metal electrodes 12 and 22 are separately located as several separate pieces on the base plate 100. Then, stress that is generated when the stretchable base plate 100 is pulled or contracted is absorbed by the stretchable substrate 10 before transferring to the first and second metal electrodes 12 and 22. Therefore, a crack is not typically generated in the first and second metal electrodes 12 and 22. That is, because an amount of external force that is transferred to the first and second metal electrodes 12 and 22 is reduced, the electrodes 12 and 22 being several separate pieces on the stretchable substrate 10, a crack is not generated therein. Accordingly, a stretchable organic light-emitting display device may be implemented to reduce or prevent cracks in the first and second metal electrodes 12 and 22 by using such a stretchable structure.

The stretchable organic light-emitting display device of the present embodiment may be manufactured by a method illustrated in FIGS. 2A through 2K. FIGS. 2A through 2F illustrate a method of manufacturing a stretchable base plate 100, which is a base of the stretchable organic light-emitting display device of the present embodiment. FIGS. 2G through 2K are diagrams illustrating a method of completing a structure of the organic light-emitting display device on the stretchable base plate 100.

Figure 2A:
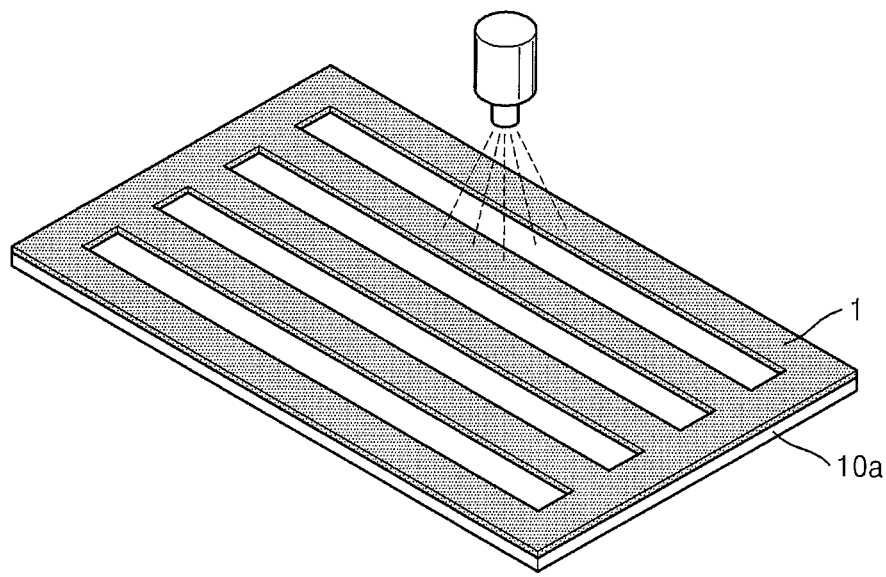
FIGS. 2A through 2K are diagrams illustrating a method of manufacturing the stretchable organic light-emitting display device of the embodiment shown in FIG. 1.
Figure 2B:
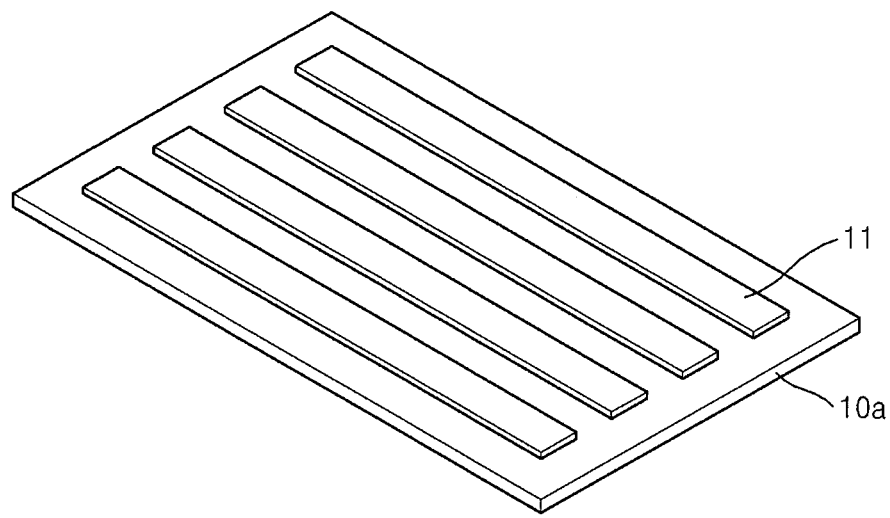

First, to make the stretchable base plate 100, as illustrated in FIG. 2A, a stretchable unit substrate 10a made of PDMS is prepared, and a first mask 1 having stripe-shaped openings is placed on the stretchable unit substrate 10a. Then, a silver nanowire solution is sprayed on the unit substrate 10a. As illustrated in FIG. 2B, a plurality of silver nanowires are formed along the stripes (e.g., in rows), thereby constituting a first power wiring 11 (e.g., a plurality of first power wirings 11 in rows).

Figure 2C:
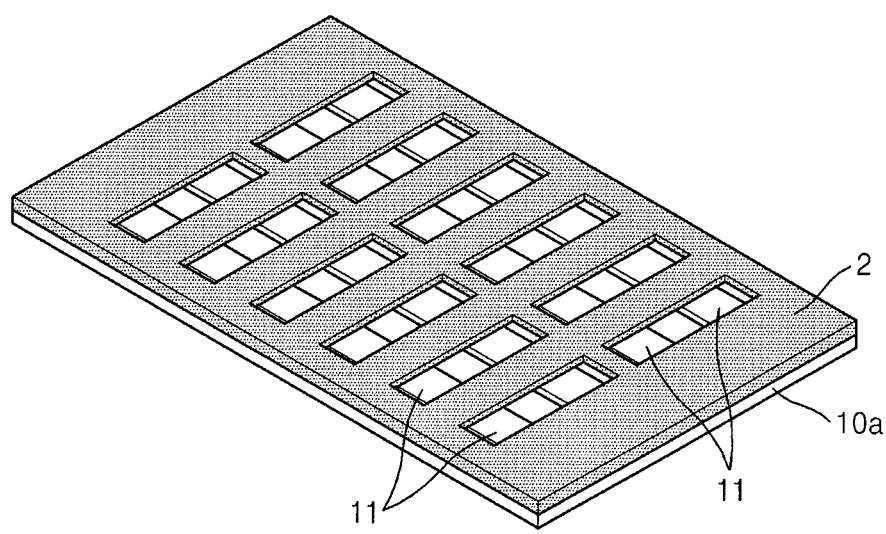
Figure 2D:
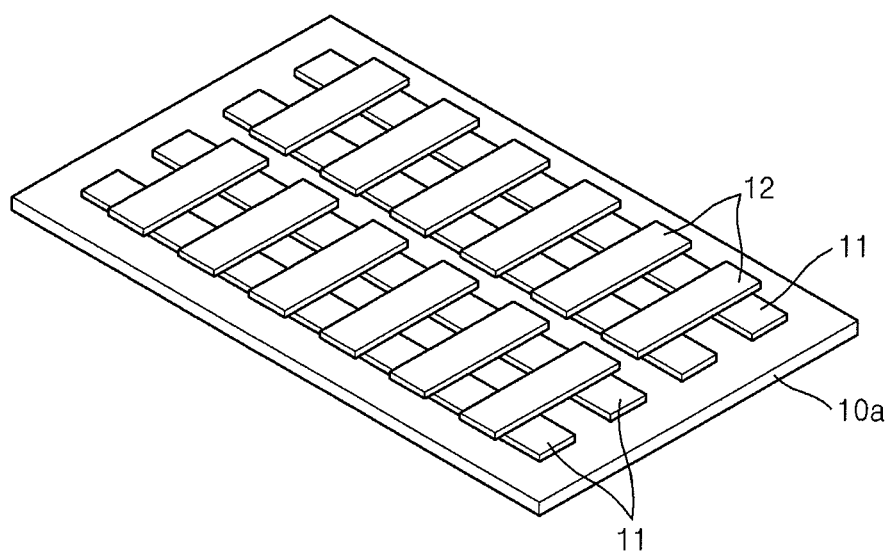

Next, as illustrated in FIG. 2C, a second mask 2 is placed on the unit substrate 10a and the first power wirings 11. Then, a metal such as, for example, aluminum is deposited on the second mask 2 to pattern what will become the first metal electrodes 12, as illustrated in FIG. 2D.

Figure 2E:
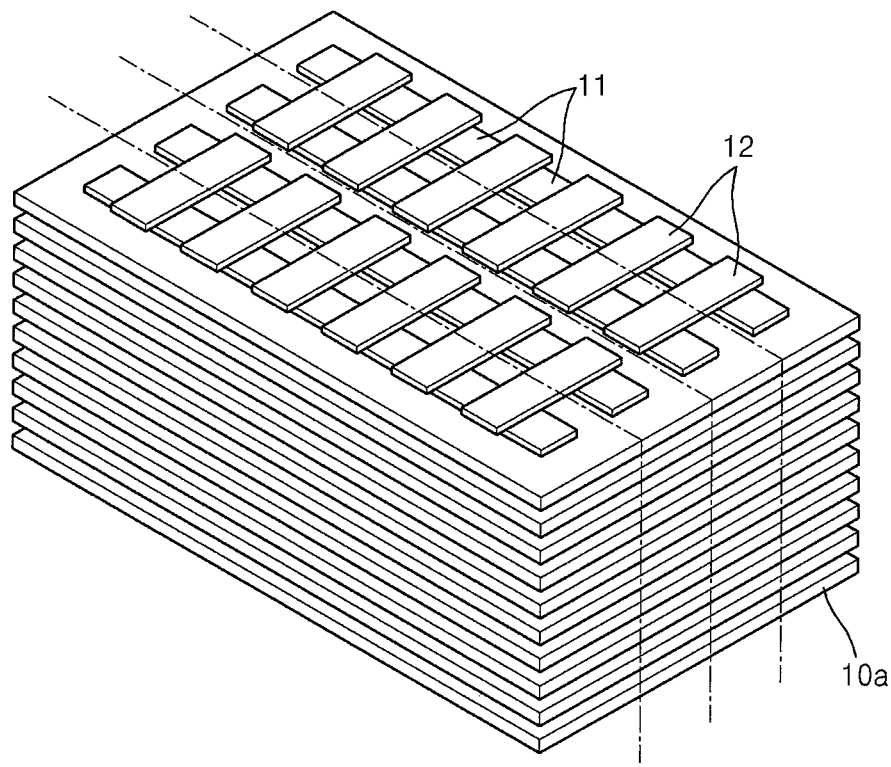

Then, as illustrated in FIG. 2E, a stack is formed by stacking several layers of unit substrates 10a on which the first power wirings 11 and the first metal electrodes 12 are formed. That is, a new unit substrate 10a having first power wirings 11 and first metal electrodes 12 is attached to the previously mentioned unit substrate 10a after being formed by following the process described with respect to FIGS. 2A through 2D. As such, the process described with respect to FIG. 2A through 2D may be repeated several times, thus allowing the formation of the stack of several layers of the unit substrates 10a.

Figure 2F:
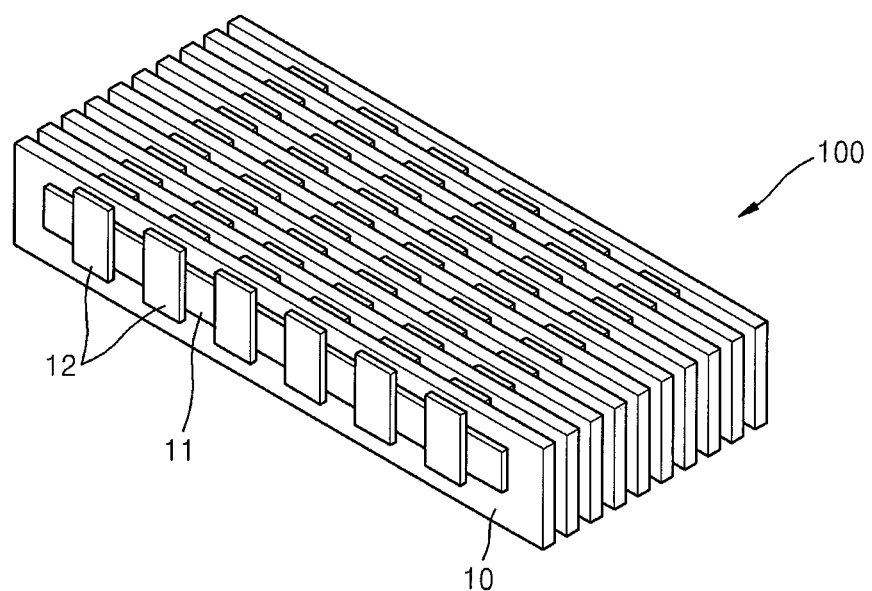

Then, the stack is cut along lines shown in FIG. 2E, the lines being parallel to the first power wirings 11. As illustrated in FIG. 2F, a stretchable base plate 100 is formed (e.g., a plurality of stretchable base plates 100 are formed). As stated above, in the stretchable base plate 100, a plurality of the unit substrates 10a are stacked to form the stretchable substrate 10. The first metal electrodes 12 are located as several separate pieces in the stretchable substrates 10 with first metal electrodes 12 in a given row (e.g., for a given layer of a unit substrate 10a) being electrically coupled to each other via a corresponding one of the first power wirings 11.

In the stretchable base plate 100, the first metal electrodes 12 are separately located as several separate pieces in the stretchable substrate 10 made of PDMS. Therefore, even when a stretching force is applied to the stretchable base plate 100, stress is not transferred to the first metal electrodes 12. Accordingly, cracks in the first metal electrode 12 may be reduced or prevented. By using the stretchable base plate 100 of the present embodiment, a passive-matrix organic light-emitting display device is manufactured later.

Figure 2G:
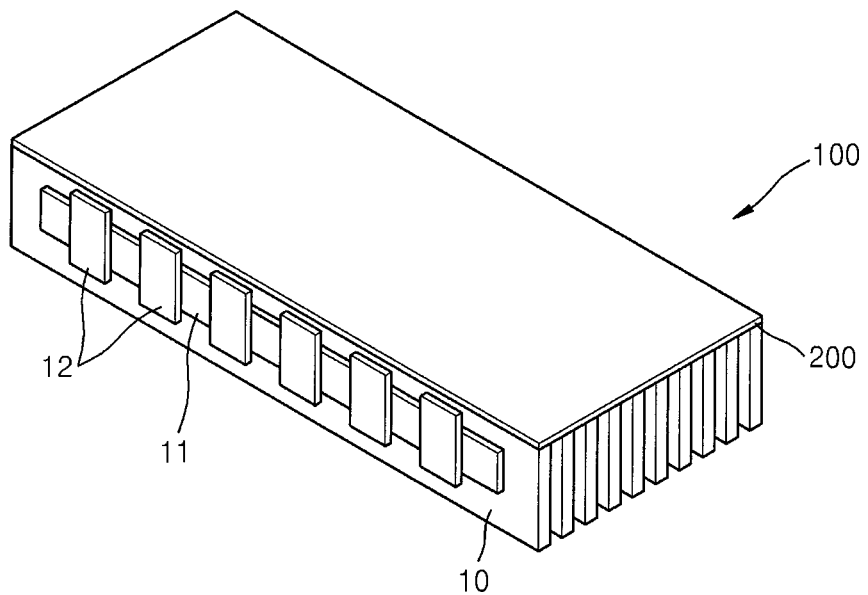

Referring to FIG. 2G, a light-emitting layer 200 is deposited and formed on the stretchable base plate 100.

Figure 2H:
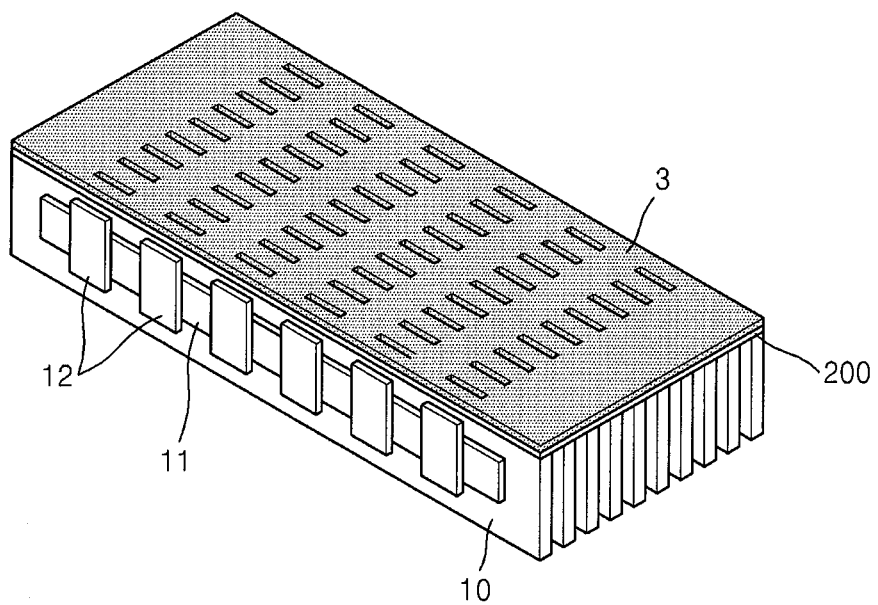
Figure 2I:
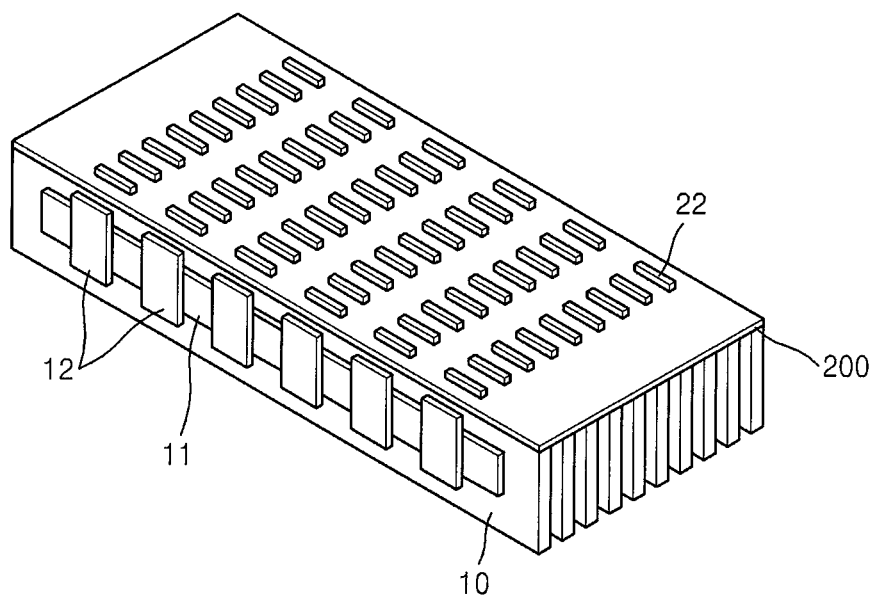

Then, as illustrated in FIG. 2H, a third mask 3 is placed on the light-emitting layer 200. A metal such as, for example, aluminum is deposited thereon to form a second metal electrode 22 (e.g., a plurality of second metal electrodes 22), as illustrated in FIG. 2I. The second metal electrodes 22 are formed at locations corresponding to the first metal electrodes 12 of the stretchable base plate 100.

Figure 2J:
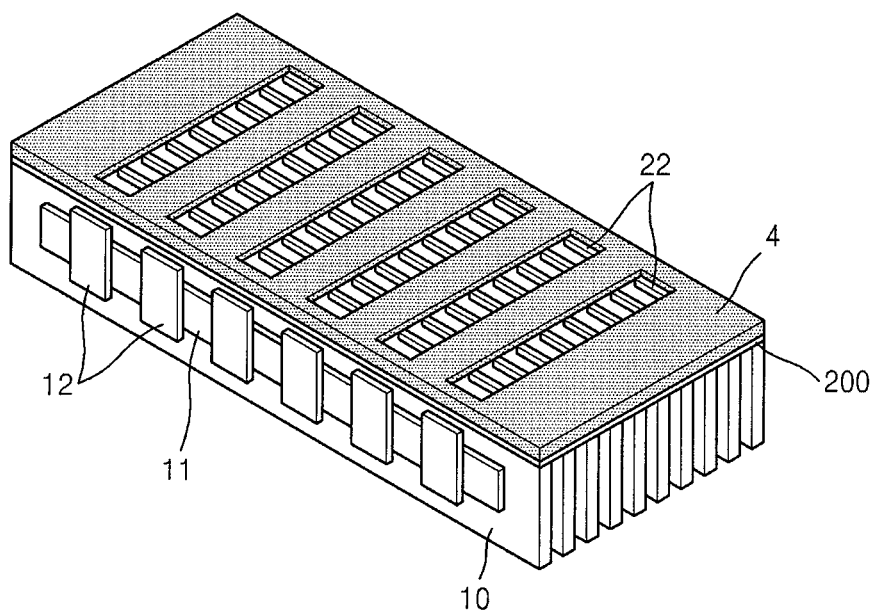
Figure 2K:
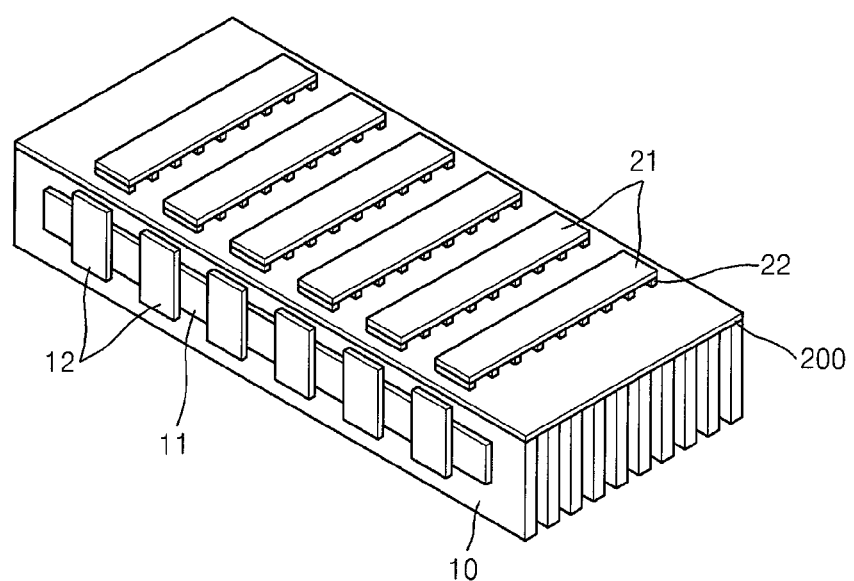

Then, by using a fourth mask 4, as illustrated in FIG. 2J, a second power wiring 21 (e.g., a plurality of second power wirings 21), for electrically coupling the second metal electrodes 22 of a given row, is formed as shown in FIG. 2K. Like the first power wirings 11, the second power wirings 21 may also be formed of silver nanowires. The first and second power wirings 11 and 21 are formed to cross each other (e.g., crossing each other vertically, or the first power wirings 11 extending in a first direction in a first plane and the second power wirings 21 extending in a second direction in a second plane that is perpendicular to the first plane, or the first power wirings 11 extending in a y-axis direction on surfaces of respective ones of the stretchable unit substrates 10*a* extending in a yz-plane and the second power wirings 21 extending in an x-axis direction on a surface of the light-emitting layer 200 extending in an xy-plane).

Then, an encapsulation substrate 300 may be formed on the second power wiring 21 (see FIG. 1). The encapsulation substrate 300 may be formed of PDMS.

When a power is selectively supplied to the first and second power wirings 11 and 21, a voltage is generated between the first and second metal electrodes 12 and 22, which are respectively placed at locations in which the first and second power wirings 11 and 21 cross each other. Thus, the light-emitting layer 200 in the corresponding area emits light.

The stretchable organic light-emitting display device that is formed thereby may be stretched without having cracks generated in the first and second metal electrodes 12 and 22. Thus, the stretchable organic light-emitting display device may allow for a stable stretching operation.

According to embodiments of the present invention providing the stretchable base plate, the stretchable organic light emitting display device, and the method of manufacturing the stretchable base plate and the stretchable organic light emitting display device, an easily stretchable product may be implemented while avoiding the generation of cracks in metal electrodes.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A stretchable base plate comprising:
    a stretchable substrate;
    metal electrodes that are separated and located in a plurality of rows on the stretchable substrate; and
    a power wiring for electrically coupling respective ones of the metal electrodes in each row.

2. The stretchable base plate of claim 1, wherein the stretchable substrate comprises a stack of several layers of unit substrates.

3. The stretchable base plate of claim 1, wherein the stretchable substrate comprises polydimethylsiloxane (PDMS).

4. The stretchable base plate of claim 1, wherein the metal electrodes comprise aluminum.

5. The stretchable base plate of claim 1, wherein the power wiring comprises silver nanowires.

6. A stretchable organic light-emitting display device comprising:
    a stretchable base plate comprising:
        a stretchable substrate;
        first metal electrodes that are separated from each other and located in a plurality of rows on the stretchable substrate; and
        first power wirings electrically coupling respective ones of the metal electrodes of each row;
    a light-emitting layer on the stretchable base plate;
    second metal electrodes located in a plurality of rows on the light-emitting layer and corresponding to the first metal electrodes;
    second power wirings for electrically coupling respective ones of the second metal electrodes of each row; and
    an encapsulation substrate covering the second power wirings.

7. The stretchable organic light-emitting display device of claim 6, wherein the stretchable substrate comprises a plurality of unit substrates stacked in layers, and
    wherein each row of the first metal electrodes corresponds to a respective one of the unit substrates.

8. The stretchable organic light-emitting display device of claim 6, wherein the stretchable substrate and the encapsulation substrate comprise polydimethylsiloxane (PDMS).

9. The stretchable organic light-emitting display device of claim 6, wherein the first and second metal electrodes comprise aluminum.

10. The stretchable organic light-emitting display device of claim 6, wherein the first power wirings and the second power wirings comprise silver nanowires.

* * * * *